United States Patent [19]
Huiting

[11] Patent Number: 5,528,164
[45] Date of Patent: Jun. 18, 1996

[54] MODIFICATION TO A Y-SCAN MONITOR CIRCUIT

[75] Inventor: Cameron Huiting, Sheridan, Calif.

[73] Assignee: NEC Electronics, Inc., Mountain View, Calif.

[21] Appl. No.: 283,459

[22] Filed: Aug. 1, 1994

[51] Int. Cl.$^6$ ............................ G01R 31/26; B60K 41/18
[52] U.S. Cl. ...................... 324/772; 324/73.1; 324/72.5; 340/648; 318/365
[58] Field of Search .................................. 324/772, 73.1, 324/72.5, 751; 318/365; 340/648

[56] References Cited

U.S. PATENT DOCUMENTS 4,963,808  10/1990  Torisawa et al. .................. 318/365
5,089,774  2/1992  Nakano ............................ 324/751

Primary Examiner—Kenneth A. Wieder
Assistant Examiner—Barry C. Bowser
Attorney, Agent, or Firm—Skjerven, Morrill, MacPherson, Franklin & Friel; Stephen A. Terrile

[57] ABSTRACT

A supplemental monitoring device which issues an error signal when the monitoring device loses motor drive pulses is disclosed. Also disclosed is providing a manufacturing system with a normally closed relay which controls the flag, thus advantageously providing a semiconductor system which automatically interrupts the ion beam in the event of a system malfunction.

12 Claims, 4 Drawing Sheets

MODIFICATION TO A Y-SCAN MONITOR CIRCUIT

FIELD OF THE INVENTION

The present invention relates to manufacturing systems and, more particularly, to monitor circuits used with semiconductor manufacturing systems.

BACKGROUND OF THE INVENTION

A semiconductor manufacturing system, such as that shown in FIG. 1, uses an ion implanter to implant a semiconductor wafer with ions. The ion implanter includes a process chamber which is coupled to a shaft; the shaft causes the process chamber to move along an axis to implant the wafers. The process chamber changes direction at both ends of the shaft. The shaft, which functions as a chamber drivescrew, is rotated using a drivescrew motor. The motor, and thus the movement of the process chamber shaft, is controlled by a dose controller which provides motor drive pulses to the motor via a translator circuit. If the process chamber ceases movement at a location other than either end of the axis and the beam is not intercepted, striping of the wafer may occur. Accordingly, it is desirable to provide a monitoring device to determine whether the process chamber is moving along the axis.

Such a monitor device prevents striping of production wafers by detecting when the process chamber is not moving. For example, a Y-scan monitor device, available from Sumomoto Eaton Inc. located in Tokyo, Japan, monitors the motion of a Y-scan process chamber by attaching an encoder to the shaft of the semiconductor manufacturing device. As the shaft rotates, the encoder sends clock pulses to the monitor device to indicate that the processor chamber is moving up and down. If the shaft stops rotating, the monitor device activates an alarm to indicate a malfunction. Additionally, the monitor device sends a hold signal to the dose controller, which sends a flag control signal to the endstation controller. The endstation controller sends a control signal to a solenoid, which is located within a pneumatic box. The pneumatic box houses solenoids, relays, and valves that operate various assemblies on the endstation of the implanter. An example of such a pneumatic box is manufactured by EATON Corp. as part of the Ion Implanter available under the trade designation NOVA 10-80 Ion Implanter. The solenoid causes a flag to actuate, thus interrupting the flow of ions from the process chamber to the wafer.

The monitor device is clocked by the motor drive pulses which are generated by the dose controller. Accordingly, when the motor drive pulses are not provided to the monitor circuit, the monitor device cannot detect malfunctions of the semiconductor system. If the motor stops and the monitor circuit does not detect a malfunction, then the ion beam burns a stripe onto the wafers that are being implanted. Additionally, because the monitor circuit controls the flag controller, if the monitor circuit malfunctions, the flag controller does not cause the flag to actuate. Accordingly, it is desirable to provide a monitor circuit which detects malfunctions of the process chamber which may be related to the motor drive pulses.

SUMMARY OF THE INVENTION

It has been discovered that providing a supplemental monitoring device which issues an error signal when the monitoring device loses motor drive pulses advantageously provides a semiconductor system with a high degree of integrity. Additionally, it has been discovered that provided a normally closed relay which controls the flag, advantageously provides a semiconductor system which automatically interrupts the ion beam in the event of a system malfunction.

In a preferred embodiment, the invention relates to an apparatus for monitoring the motion of a process chamber of a semiconductor manufacturing system which includes an encoder, a monitoring device and a supplemental monitoring device. The encoder is coupled to the shaft of the process chamber and provides motion information indicating that the shaft is moving. The monitoring device is coupled to encoder and receives the motion information and determines whether the process chamber is functioning properly in response to the motion information. The monitoring device is controlled by a motor drive signal. The supplemental monitoring device receives the motor drive signal and determines whether the process chamber is functioning properly in response to the motor drive signal.

Additionally, the supplemental monitoring device may include a motor drive monitoring portion electrically coupled to receive the motor drive signal, the motor drive monitoring portion providing a motor drive error signal when the motor drive signal is not active. Additionally, the supplemental monitoring device may include an implant hold monitoring portion electrically coupled to receive an implant hold signal, the implant hold monitoring portion providing an implant hold error signal when the implant hold signal is not active.

BRIEF DESCRIPTION OF THE INVENTION

DETAILED DESCRIPTION

The following sets forth a detailed description of the best contemplated mode for carrying out the invention. The description is intended to be illustrative of the invention and should not be taken to be limiting.

Figure 1:
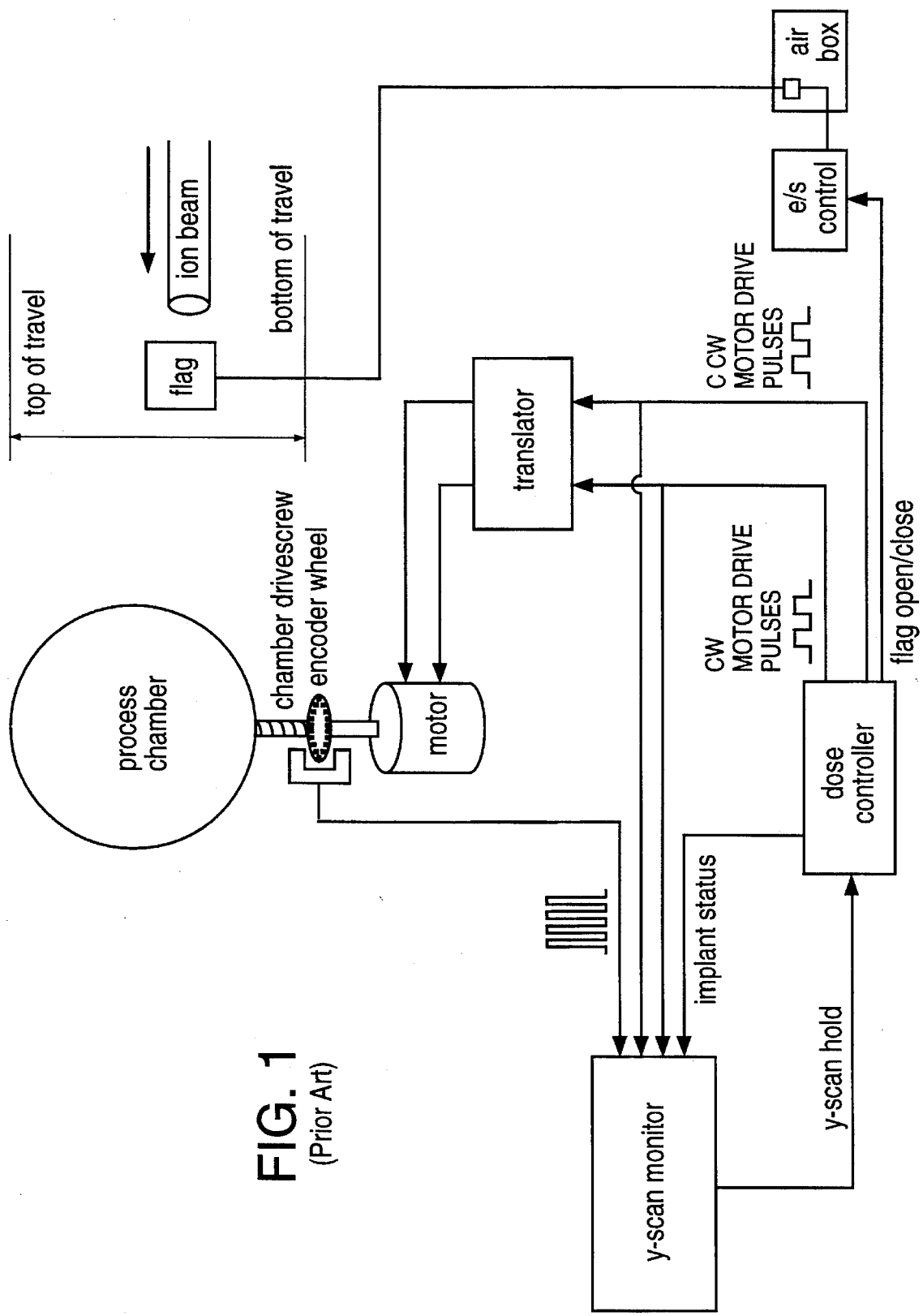
FIG. 1 is a block diagram of a prior art semiconductor processing system.
Figure 2:
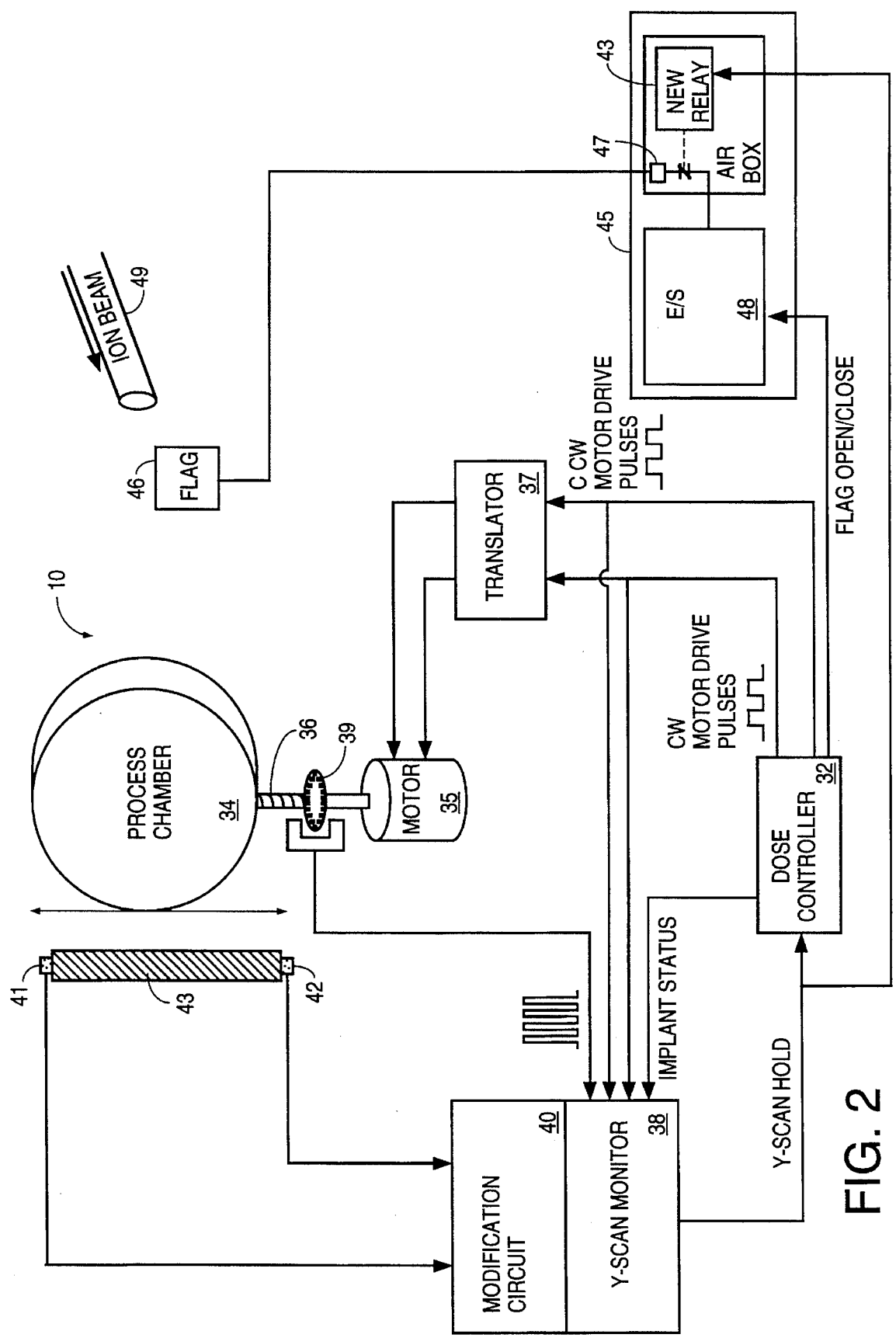
FIG. 2 is a block diagram of a semiconductor processing system which includes a supplemental monitoring device in accordance with the present invention.

Referring to FIG. 2, semiconductor processing system 10 includes semiconductor dose controller 32 as well as process chamber 34 which moves along the y-axis under control of drivescrew shaft 36. Shaft 36 is coupled to motor 35. Motor 35 receives motor drive pulses from dose controller 32 via translator 37; the motor drive pulses control the operation of the motor.

Semiconductor processing system 10 also includes y-scan monitoring circuit 38 which is coupled to encoder 39 as well as supplemental monitoring circuit 40. Supplemental monitoring circuit 40 is coupled to detectors 41, 42 which are mounted on frame 43 at the top and bottom of the range of motion of drivescrew 36, respectively. Supplemental monitoring circuit 40 is also coupled to dose controller 32 via monitor circuit 38. Faraday flag controller 45 is coupled with dose controller 32 and monitor circuit 40. Faraday flag controller 45 is coupled with faraday flag 46. Faraday flag controller 45 includes pneumatic box 47 and end station controller 48.

In operation, at the beginning of an implant, dose controller 32 issues a command to open faraday flag 46 to pneumatic box 47 via endstation controller 48. Faraday flag 46 is actuated to open and lets the ion beam 49 hit the wafers which are within process chamber 34. Dose controller 32 then issues motor drive pulses to translator 37 which amplifies the motor drive pulses so that they can be used by motor 35. Drivescrew 36 starts to rotate and causes chamber 34 to travel downwardly when screw 36 is rotating clockwise and upwardly when screw 36 is rotating counter clockwise.

As screw 36 rotates, encoder 39 provides pulses to Y-scan monitor circuit 38. Monitor circuit 38 also uses motor drive pulses issued from dose controller 32 to clock its internal electronics. If screw 36 stops rotating during an implant, encoder 39 stops sending pulses to monitor circuit 38 and monitor circuit 38 issues a hold signal to dose controller 32 only if monitor circuit 38 is still receiving the motor drive pulses. Dose controller 32 then issues a close flag command to faraday flag controller 45.

An alternate error condition arises if dose controller 32 stops issuing motor drive pulses during an implant. With this condition, dose controller 32 stops issuing motor drive pulses to motor 35 which causes motor 35 to stop and thus screw 36 to stop rotating. Encoder 39 stops sending pulses to monitor circuit 38, but monitor circuit 38 does not send a hold signal to dose controller 32 because monitor circuit 38 is not receiving motor drive pulses for clocking its internal electronics. Accordingly, monitor circuit 38 does not cause faraday flag 46 to close.

However, supplemental monitor circuit 40 monitors motor drive pulses to determine whether motor drive pulses are present during implant. If there are no motor drive pulses, then supplemental monitor circuit 40 sends an error signal to Y-scan monitor circuit 38 and Y-scan monitor circuit 38 sends a hold signal to dose controller 32. Supplemental monitor circuit 40 uses sensors 41, 42 to determine whether process chamber 34 is at the top or bottom of its travel. Sensors 41, 42 disable supplemental monitor circuit 40 when process chamber 34 changes direction at the top and bottom of its travel.

If there is no hold signal being issued by Y-scan monitor circuit 38, then the relay in pneumatic box 47 is not energized and the relay contacts are closed, thus allowing the flag open/close signal to energize the solenoid valve of pneumatic box 47. When the solenoid valve of pneumatic box 47 energizes, it supplies air to faraday flag 46 and faraday flag 46 opens. In this state, dose controller 32 controls faraday flag 46. However, when there is a hold signal issued from Y-scan monitor circuit 38, then the relay 43 energizes and its contacts open thereby deenergizing the solenoid valve of pneumatic box 47, which causes air to be removed from faraday flag 46. Accordingly, flag 46 closes and intercepts ion beam 49. Accordingly, Y-scan monitor circuit 38 closes faraday flag 46 when there is an error condition during implant. System 10 does not rely upon dose controller 32 to close faraday flag 46. Accordingly, even if dose controller 32 is malfunctioning, faraday flag 46 may be closed.

Figure 3:
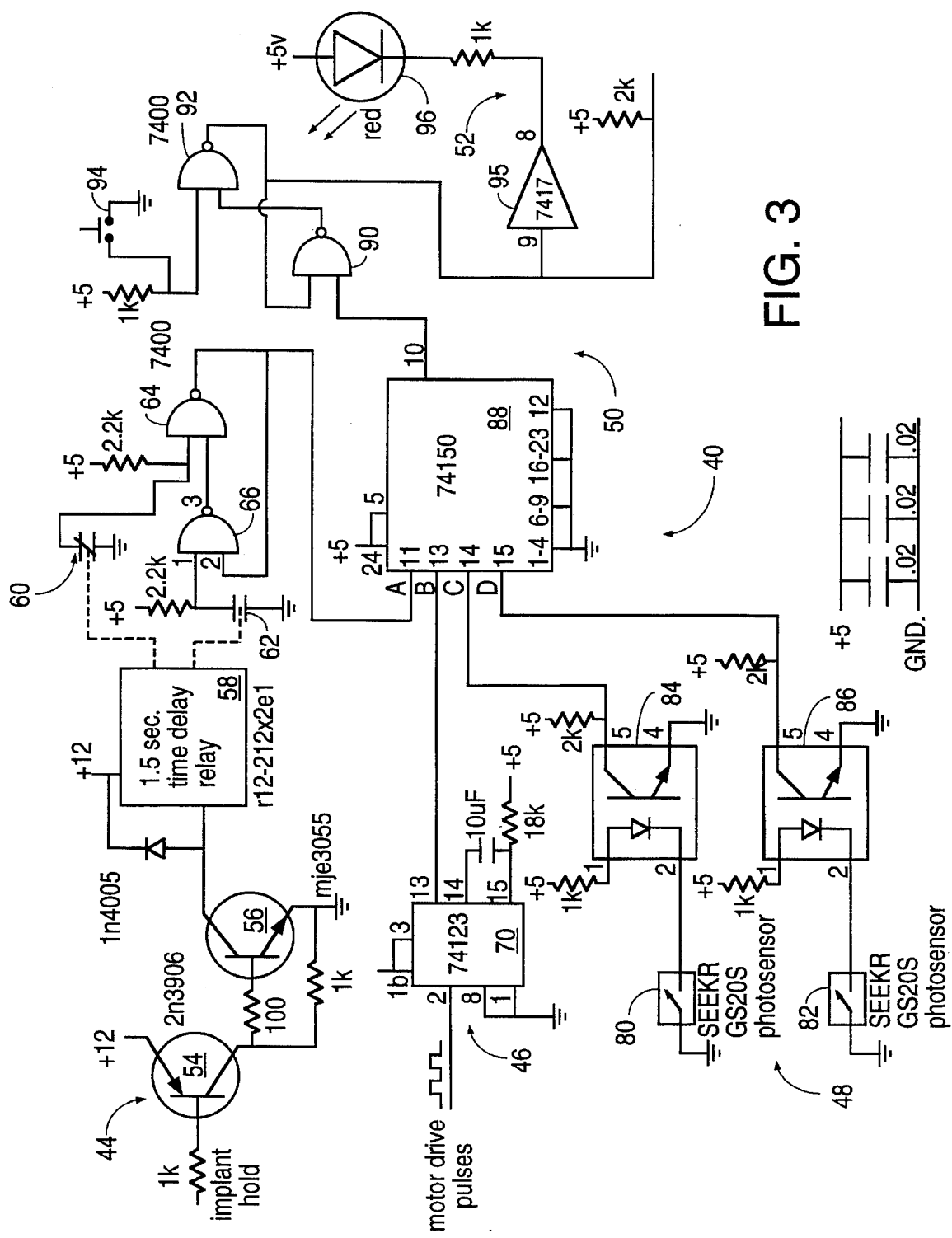
FIG. 3 is a schematic diagram of a supplemental monitoring circuit of the FIG. 2 system in accordance with the present invention.

Referring to FIG. 3, supplemental monitoring circuit 40 includes implant hold signal monitor portion 44, motor drive signal monitor portion 46, chamber end of travel monitor portion 48, signal analysis portion 50 and alarm portion 52. Implant hold signal monitor portion 44, motor drive signal monitor portion 46 and chamber end of travel monitor portion 48 provide input signals to signal analysis portion 50. Signal analysis portion 50 analyzes these input signals and provides an output to alarm portion 52 based upon these signals.

Implant hold signal monitor portion 44 includes PNP transistor 54 which is coupled to NPN transistor 56. NPN transistor 56 is coupled with 1.5 second time delay relay 58 which provides control signals to normally closed switch 60 and normally open switch 62. Normally closed switch 60 is coupled to nand gate 64 which provides a feed back output to nand gate 66. The other input of nand gate 66 is coupled to normally open switch 62. The output of nand gate 64 is also coupled to signal analysis portion 50.

Motor drive monitor portion 46 includes one shot circuit 70 which is configured to provide a high output signal when motor drive pulses are present. One shot circuit 70 uses a one shot chip, which is available from Texas Instruments under the trade designation 74123.

Chamber end of travel monitor portion 48 includes photo sensor 80 which is included within detector 41 located at the top of the path of chamber 34 and photo sensor 82 which is included within detector 42 located at the bottom of the path of chamber 34. Photo sensor 80 provides an input to optical isolator 84 and photo sensor 82 provides an input to optical isolator 86. Optical isolators 84, 86 provide inputs to signal analysis portion 50.

Signal analysis portion 50 includes programmable logic array circuit 88 which is designed to receive the control signals from implant hold monitor portion 44, motor drive monitor portion 46 and the optical isolators of chamber end of travel monitor portion 48 and to provide warning signal to alarm portion 52 when predetermined conditions are present. Programmable logic array circuit 88 is, for example, available from Texas Instruments under the trade designation 74150.

Alarm portion 52 includes nand gate 90 which is coupled to nand gate 92. Nand gate 90 receives the warning output from signal analysis portion 50 as well as a feedback output from nand gate 92. Nand gate 92 receives the output from nand gate 90 as well as an input from reset switch 94. In addition to providing the feedback to nand gate 90, nand gate 92 provides the error signal to driver 95 as well as to monitoring system 38. Driver 95 is available from Texas Instruments under the trade designation 7417. Driver 95 provides an alarm signal to LED 96, which is available from Hewlett Packard under the trade designation HLMP-1000.

In operation, motor drive pulses, implant hold signals and chamber end of travel status are monitored by supplemental monitoring system 40 to assure that semiconductor processing system 30 is functioning properly.

More specifically, the motor drive pulses from dose controller 32 are provided to retriggerable oneshot 70, which is configured to provide a TTL logic level high voltage when the motor drive pulses are received to indicate that motor drive pulses are present.

Switches 80, 82 which are mounted to the top and bottom of implanter frame 43 close when the stage is at the top or the bottom of the frame. When the stage is at the top, the top sense switch closes and turns on opto-isolator 84. The output of opto-isolator 84 goes low. When the stage is at the bottom turn around point of the frame, bottom sense switch 82 closes and turns on opto-isolator 86. The output of opto-isolator 86 goes low. These switches prevent supplemental monitoring system 22 from issuing an error to Y-scan monitor 38 at the top and bottom of the travel of the stage.

When the stage is at the top and implant begins, the implant hold signal from the dose goes low about six seconds before motor drive pulses are issued. If the top sense switch was not provided, supplemental monitor system 22 would issue an error at the beginning of every implant.

When the stage turns around at the bottom of travel, the pulses stop momentarily as the dose controller changes the direction of the stage. If the bottom sense switch was not used, supplemental monitoring system 22 would issue an error every time the stage reversed direction at the bottom of frame 43.

The implant hold signal is taken from Y-scan monitoring circuit 38. The implant hold signal is low during implant. When implant begins, the hold signal goes low and turns on PNP transistor 54. PNP transistor 54 turning on turns on NPN transistor 56. NPN transistor 56 energizes time delay relay 58. After 1.5 seconds, relay 58 changes states and the output of the debounce circuit goes low.

When the normally closed contact opens, the input to nand gate 64 is pulled high. By pulling one of the inputs of nand gate 64 high, nand gate 64 is enabled. When the normally open contact closes, a low is then applied to the input of nand gate 66, thus making the output high. This high is provided to nand gate 64. With both inputs high, the output of nand gate 64 goes low. This low is fed back to nand gate 66 and latches the debounce circuit. Accordingly, this debounce circuit provides the interface between relay 58 and signal analysis portion 50.

The time delay relay is needed because when an implant is restarted after being halted, the implant hold signal goes low about one second before the motor drive pulses are issued. If discrepancy between the motor drive pulses and the implant hold signal was not taken into account, supplemental monitoring system 22 would issue an error every time the implant was restarted after a hold.

Signal analysis circuit 50 uses a 16-bit multiplexer as a logic circuit. The output of signal analysis circuit 50 goes low only when the following conditions are met: the output of implant hold portion 44 is low, indicating that the semiconductor implant system is in implant mode; the output of motor drive portion 46 is low, indicating that supplemental monitoring system 22 is not receiving motor drive pulses; and, both outputs of chamber end of travel portion 48 are high, indicating that process chamber 34 is not at the top or bottom of its range of motion.

Signal analysis circuit 50 provides an alarm signal to nand gate 90, which in conjunction with nand gate 92, latches the alarm signal. If an error occurs, as indicated by a low alarm signal, the latch keeps the error signal latched, causing monitor system 38 to be held in an error condition. Reset button 94 resets the latch after the error has been corrected.

In addition to activating LED 96 when an error is detected, supplemental monitor circuit 22 clears Y-scan monitor circuit 38, which generates a hold signal, which is provided to dose controller 32. Y-scan monitor circuit 38 cannot clear the hold signal, and thus reset dose controller 32, until the error which caused supplemental monitoring system 22 to generate the alarm signal has been corrected.

Figure 4:
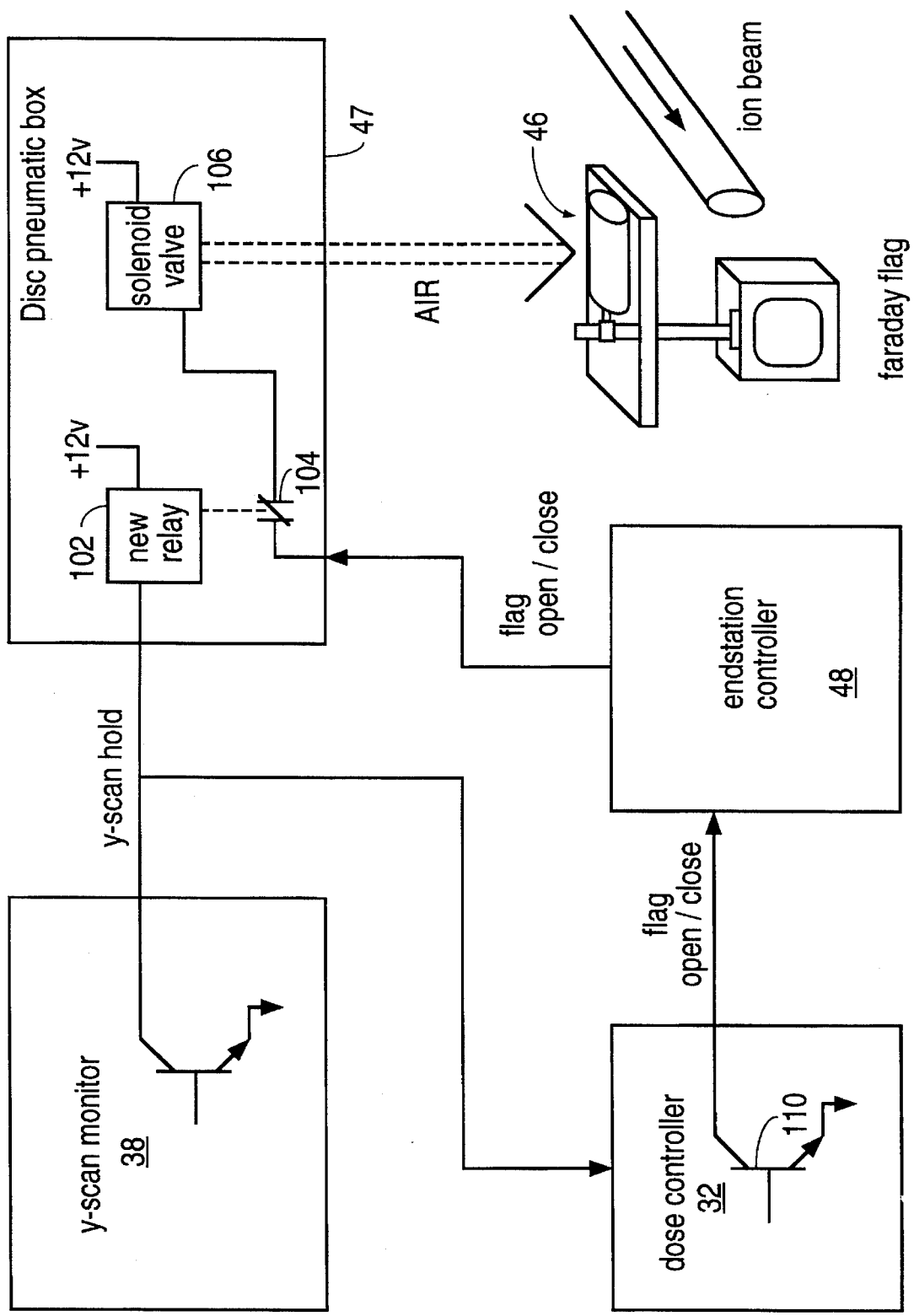
FIG. 4 is a block diagram of a flag portion of the FIG. 2 system.

Referring to FIG. 4, Y-scan monitor circuit 38 is used in conjunction with pneumatic box 47 to prevent striping of wafers when a fault is detected. Pneumatic box 47 includes relay 102, which is coupled to the hold signal that is provided by monitor circuit 38, normally closed contacts 104, which are coupled to the flag signal that is provided by end station controller 48 which amplifies the flag open/close signal. Normally closed contacts 104 provides their output to solenoid valve 106. Solenoid valve 106 controls faraday flag 46. Accordingly, by coupling the flag control signal to normally closed contacts, if an error occurs in which the flag close signal is not able to be provided to the pneumatic box 47, pneumatic box 47, by virtue of normally closed contacts 104, causes faraday flag 46 to close and stop the ion beam from implanting the wafers.

Dose controller 32 controls the opening and closing of flag 46. The output of dose controller 32 is either high or low depending on the state of output transistor 110. The flag open/close signal is routed through endstation controller 48 which amplifies the flag open/close signal. The flag open/close signal is then routed to pneumatic box 47. When the flag open/close signal is low, solenoid 106 energizes and applies air to faraday flag 46. Faraday flag 46 opens when air is applied to it and allows ion beam 49 to implant the wafers.

When an error occurs during an implant, Y-scan monitor circuit 38 issues a hold signal to dose controller 32. Dose controller 32 then causes pneumatic box 47 to close faraday flag 46.

Y-scan monitor circuit 38 provides the hold signal to the new relay 102. Accordingly, if there is no hold signal provided by Y-scan monitor circuit 38, then the hold signal is high and relay 102 is off. The contacts 104 remain closed and solenoid valve 106 is controlled by dose controller 32. If dose controller 32 malfunctions, then it is no longer able to close flag 46. However, the Y-scan hold signal, which is also routed to Y-scan relay 102 may perform this function.

By adding relay 102, which is linked to the normally closed contracts of switch 104, and routing the Y-scan hold signal directly to relay 102, system 10 advantageously provides a flag controller which operates even when dose controller 32 is malfunctioning.

Other Embodiments

Other embodiments are within the following claims.

What is claimed is:

1. An apparatus for monitoring the motion of a process chamber of a semiconductor manufacturing system, the process chamber being coupled to a shaft, the shaft being coupled to a motor for driving the shaft, the motor driving the shaft under control of a dose controller, the apparatus comprising:

an encoder coupled to the shaft of the process chamber, the encoder providing motion information indicating that the shaft is moving;

a monitoring device coupled to encoder, the monitoring device receiving the motion information and determining whether the process chamber is functioning properly in response to the motion information, the monitoring device being controlled by a motor drive signal, the motor drive signal being generated by the dose controller; and a supplemental monitoring device for receiving the motor drive signal, the supplemental monitoring device determining whether the dose controller is issuing the motor drive signal and providing a motor drive error signal when the dose controller is not issuing the motor drive signal.

2. The apparatus of claim 1 wherein the motor drive signal includes motor drive pulses, and the motor drive signal is not active when the pulses are not present.

3. The apparatus of claim 1 wherein the supplemental monitoring device includes a implant hold monitoring portion electrically coupled to receive an implant hold signal, the implant hold monitoring portion providing an implant hold error signal when the implant hold signal is not active.

4. The apparatus of claim 1 wherein the supplemental monitoring device includes a chamber motion monitor portion for providing a chamber motion signal to indicate when the chamber is not in motion.

5. The apparatus of claim 4 wherein the chamber motion monitor portion includes a sensor for determining when the chamber is at the end of its range of motion, the sensor indicating that the chamber is reversing direction.

6. The apparatus of claim 4 wherein the supplemental monitoring device uses the indication of the chamber not in motion to determine whether an error is present.

7. An apparatus for monitoring the motion of a process chamber of a semiconductor manufacturing system, the semiconductor manufacturing system including an encoder, the encoder coupled to a shaft of the process chamber, the shaft being coupled to a motor for driving the shaft, the motor driving the shaft under control of a dose controller, the encoder providing motion information indicating that the shaft is moving, the apparatus comprising:

a monitoring device coupled to encoder, the monitoring device receiving the motion information and determining whether the process chamber is functioning properly in response to the motion information, the monitoring device being controlled by a motor drive signal, the motor drive signal being generated by the dose controller; and a supplemental monitoring device for receiving the motor drive signal, the supplemental monitoring device determining whether the dose controller is issuing the motor drive signal and providing a motor drive error signal when the dose controller is not issuing the motor drive signal.

8. The apparatus of claim 7 wherein the motor drive signal includes motor drive pulses, and the motor drive signal is not active when the pulses are not present.

9. The apparatus of claim 7 wherein the supplemental monitoring device includes a implant hold monitoring portion electrically coupled to receive an implant hold signal, the implant hold monitoring portion providing an implant hold error signal when the implant hold signal is not active.

10. The apparatus of claim 7 wherein the supplemental monitoring device includes a chamber motion monitor portion for providing a chamber motion signal to indicate when the chamber is not in motion.

11. The apparatus of claim 10 wherein the chamber motion monitor portion includes a sensor for determining when the chamber is at the end of its range of motion, the sensor indicating that the chamber is reversing direction.

12. The apparatus of claim 11 wherein the supplemental monitoring device uses the indication of the chamber not in motion to determine whether an error is present.

* * * * *